United States Patent
Sun

(10) Patent No.: US 8,408,921 B2
(45) Date of Patent: Apr. 2, 2013

(54) FASTENING DEVICE AND PRINTED CIRCUIT BOARD ASSEMBLY HAVING SAME

(75) Inventor: Zheng-Heng Sun, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 177 days.

(21) Appl. No.: 13/107,958

(22) Filed: May 15, 2011

(65) Prior Publication Data

US 2012/0270421 A1    Oct. 25, 2012

(30) Foreign Application Priority Data

Apr. 20, 2011    (CN) .......................... 2011 1 0098610

(51) Int. Cl.
*H01R 12/00* (2006.01)
*H05K 1/00* (2006.01)

(52) U.S. Cl. .............................. 439/67; 439/77; 361/759

(58) Field of Classification Search ............ 439/67, 439/77, 492, 493; 361/759
See application file for complete search history.

(56) References Cited

U.S. PATENT DOCUMENTS

| 5,954,536 | A  * | 9/1999  | Fuerst et al.    | 439/493 |
| 6,336,816 | B1 * | 1/2002  | Yatskov et al.   | 439/67  |
| 6,634,890 | B2 * | 10/2003 | Peterson et al.  | 439/67  |
| 7,766,669 | B2 * | 8/2010  | Schmidgall et al.| 439/67  |
| 8,300,418 | B2 * | 10/2012 | Sun              | 361/759 |
| 2011/0317379 | A1 * | 12/2011 | Sun           | 361/759 |

* cited by examiner

*Primary Examiner* — Hae Moon Hyeon
(74) *Attorney, Agent, or Firm* — Altis Law Group, Inc.

(57) ABSTRACT

A printed circuit board (PCB) assembly includes a flexible printed circuit board (FPCB), a connector, a rigid PCB, and a fastening device. The rigid PCB includes a loading surface, a bottom surface opposite to the loading surface, and two pins protruding from the bottom surface. The loading surface contacts the FPCB. The FPCB is electrically connected to the rigid PCB through the connector. The fastening device includes a pressing plate, two fastening bars and two connecting arms. The pressing plate includes a pressing surface contacting the FPCB. The fastening bars are parallel to the pressing surface. Each fastening bar includes a hook grappling with a corresponding pin. Each hook includes a resisting surface resisting on the bottom surface. Each connecting arm connects the pressing plate and a corresponding fastening bar.

20 Claims, 4 Drawing Sheets

FASTENING DEVICE AND PRINTED CIRCUIT BOARD ASSEMBLY HAVING SAME

BACKGROUND

1. Technical Field

The present disclosure relates to printed circuit boards (PCBs) and, particularly, to a PCB assembly having a fastening device for fastening flexible printed circuit boards (FPCBs) on rigid printed circuit boards (PCBs).

2. Description of Related Art

FPCBs need fastening devices to be fastened on rigid PCBs to prevent separation from the rigid PCBs, when the FPCBs are electrically connected to the rigid PCBs. A fastening device includes a pressing plate for pressing the FPCB on the rigid PCB. The pressing plate is fastened on the rigid PCB with screws, thus some screw holes need to be formed in the pressing plate corresponding to the screws, which will occupy the area that is used for the wiring layout of the rigid PCB.

Therefore, it is desirable to provide a fastening device and a printed circuit board (PCB) assembly having same that can overcome the above-mentioned limitations.

BRIEF DESCRIPTION OF THE DRAWINGS

Many aspects of the embodiments should be better understood with reference to the following drawings. The components in the drawings are not necessarily drawn to scale, the emphasis instead being placed upon clearly illustrating the principles of the present disclosure.

DETAILED DESCRIPTION

Figure 1:
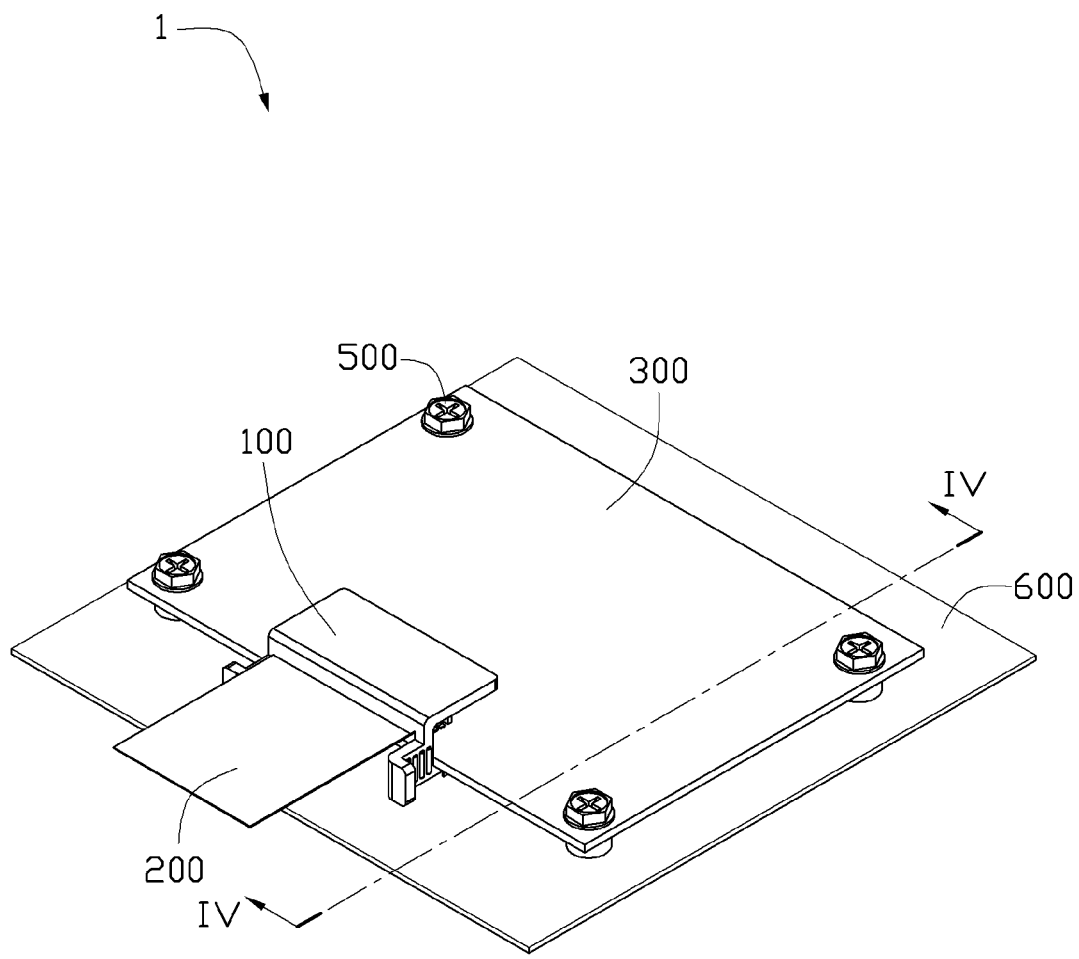
FIG. 1 is a schematic view of a PCB assembly, according to an exemplary embodiment.
Figure 2:
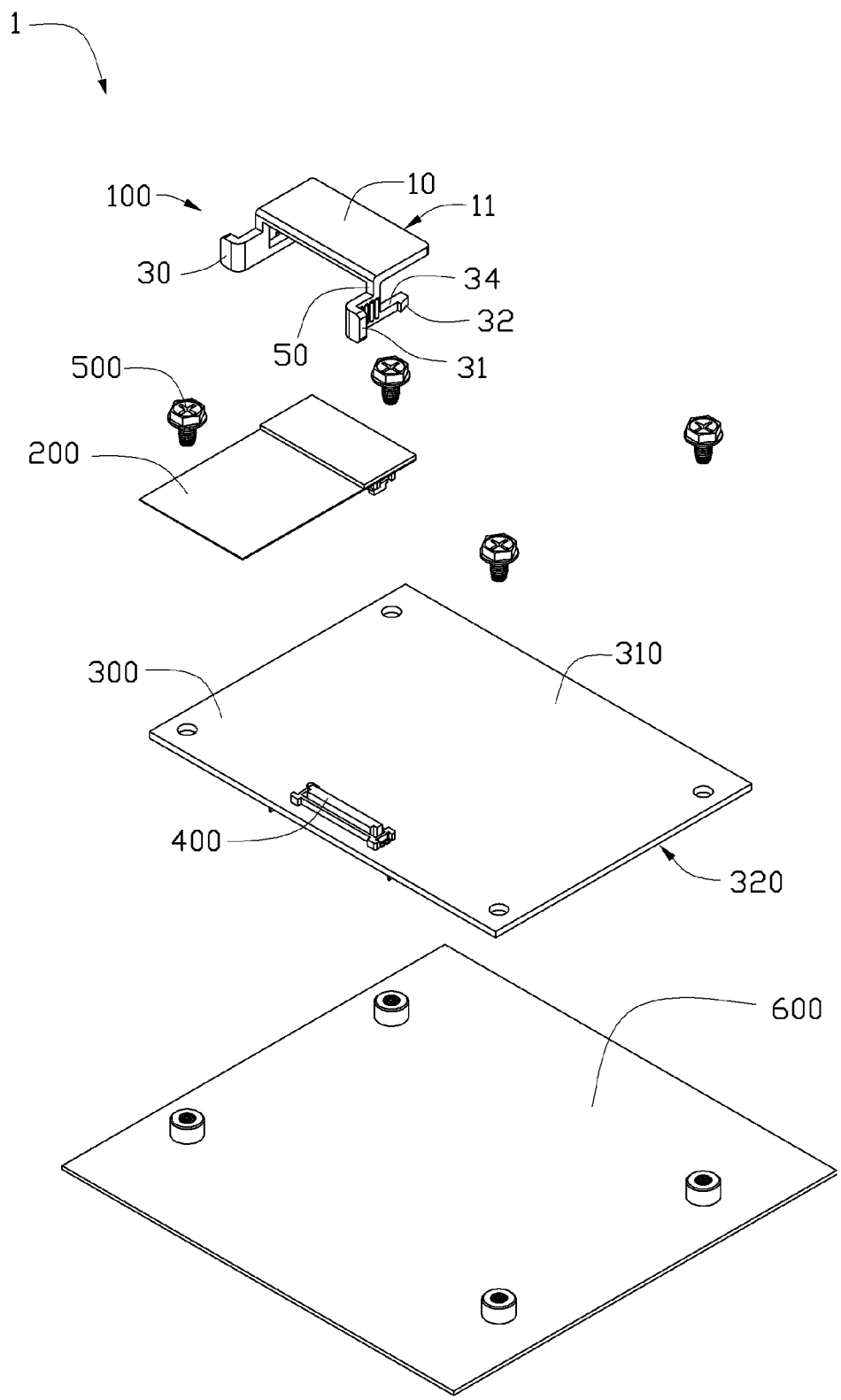
FIG. 2 is a schematic, exploded view of the PCB assembly of FIG. 1.
Figure 3:
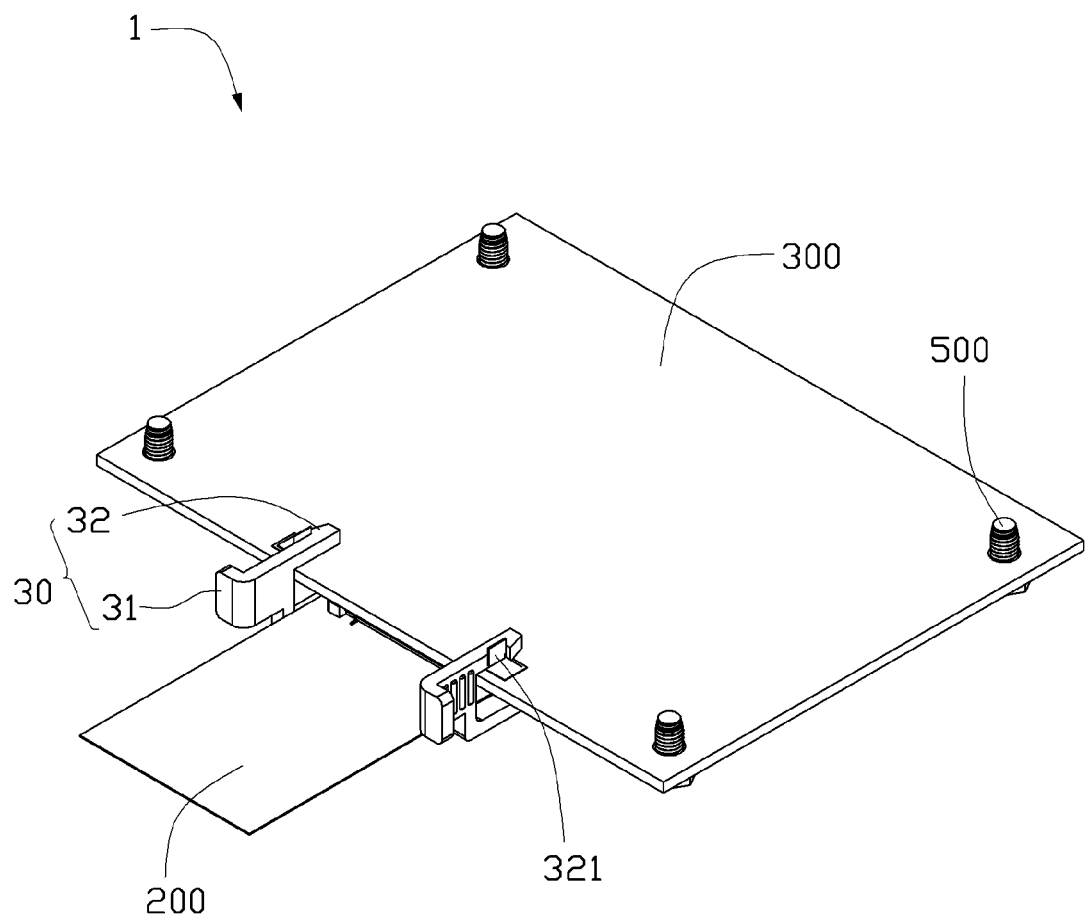
FIG. 3 is a schematic view of the PCB assembly of FIG. 1 without a fastening plate, from another view.

Referring to FIGS. 1-3, a PCB assembly 1, according to an exemplary embodiment, includes a fastening device 100, an FPCB 200, a rigid PCB 300, a connector 400, four screws 500, and a fastening plate 600. The FPCB 200 is electrically connected to a loading surface 310 of the rigid PCB 300 through the connector 400. The rigid PCB 300 further includes a bottom surface 320 opposite to the loading surface 310. Two pins 321 protrude from the bottom surface 320. The four screws 500 are used for fastening the rigid PCB 300 on the fastening plate 600. In this embodiment, the rigid PCB 300 is a computer motherboard. The fastening plate 600 is a part of a computer shell. The number of screws is not limited to this embodiment.

The fastening device 100 is used for fastening the FPCB 200 on the loading surface 310, and includes a pressing plate 10, two fastening bars 30, and two connecting arms 50.

The pressing plate 10 is substantially rectangular shaped, and includes a pressing surface 11 configured for pressing the FPCB 200 on the rigid PCB 300.

The two fastening bars 30 are disposed on two opposite ends of the pressing surface 11, and are parallel to the bottom surface 320. Each fastening bar 30 includes an L-shaped handle 31 and a hook 32 extending outward from the handle 31. A surface of the handle 31 opposite to the other handle 31 forms an anti-skid pattern to increase the force of friction between the handle 31 and the user's hand. Each hook 32 is used for grappling with the corresponding pin 321, and includes a resisting surface 34 resisting on the bottom surface 320. Along a direction perpendicular to the loading surface 310, the distance between the pressing surface 11 and the resisting surface 34 is equal to the total thickness of the FPCB 200, the connector 400, and the rigid PCB 300, and thus the FPCB 200 is firmly fixed on the rigid PCB 300 by the pressing plate 10. In this embodiment, the distance between the two fastening bars 30 is larger than that of the two pins 321 when the two fastening bars 30 are at an original state. The two fastening bars 30 can make elastic deformation, and the distance between the two fastening bars 30 can be less than that of the two pins 321 when the two fastening bars 30 are pressed towards each other.

The two connecting arms 50 are respectively used for fastening the pressing plate 10 and the two fastening bars 30. In this embodiment, one end of the connecting arm 50 is fixed on the pressing surface 11, the other end of the connecting arm 50 is fixed on the adjoining portion between the handle 31 and the hook 32.

Figure 4:
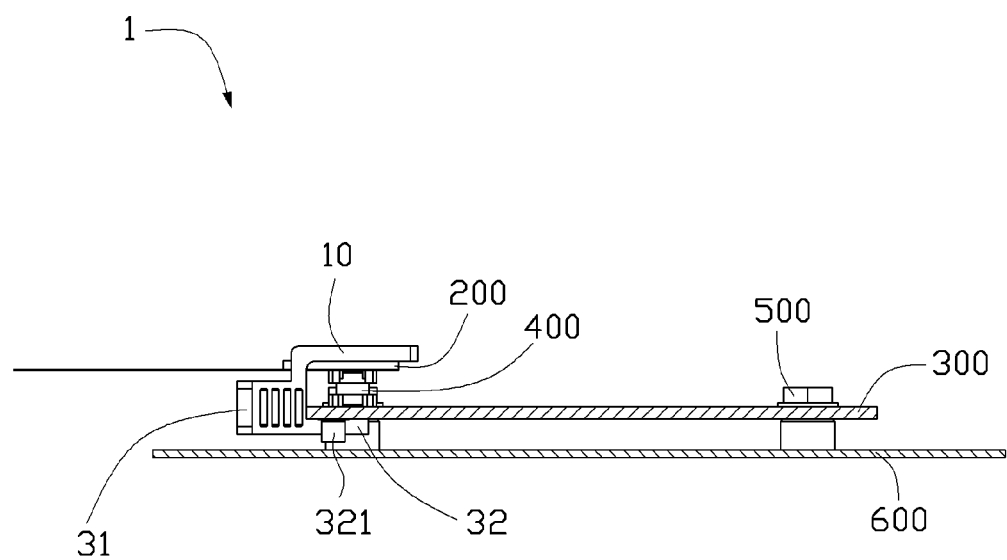
FIG. 4 is a cross-sectional view of the PCB assembly taken along a line IV-IV of FIG. 1.

Also referring to FIG. 4, in use, the pressing plate 10 is pressed on the FPCB 200, one handle 31 are pressed towards the other handle 31, the distance between the two handles 31 is reduced less than that of the two pins 321. The hooks 32 can be inserted between the two pins 321. The handles 31 are released, the two hooks 32 are resiled to grapple with the corresponding pin 321, thus, the FPCB 200 is detachably fixed on the rigid PCB 300 through the fastening device 100, and the rigid PCB 300 does not need to define screw holes to save the wiring layout space of the rigid PCB 300. When the FPCB 200 needs to be dismantled from the rigid PCB 300, the two handles 31 are pressed towards each other again, the two hooks 32 are separated from the corresponding pins 321, then the fastening device 100 is removed, therefore, the FPCB 200 can be dismantled from the rigid PCB 300 easily.

In this embodiment, the extending directions of the two fastening bars 30 are parallel to each other. In other embodiments, the two fastening bars 30 also can form an acute angle or an obtuse angle.

In this embodiment, the extending directions of the two connecting arms 50 are substantially perpendicular to the pressing surface 11. In other embodiments, the two extending directions of the two connecting arms 50 also can form a same acute/obtuse angle with the bottom surface 320.

In this embodiment, the fastening device 100 is integrated, and is made of elastic material. In other embodiments, the fastening device 100 does not need to be integrated, the pressing plate 10 is made of rigid metal material, and the two fastening bars 30 and the two connecting arms 50 are made of elastic material.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A printed circuit board (PCB) assembly comprising:
a flexible printed circuit board (FPCB)
a connector;
a rigid PCB, wherein the rigid PCB comprises a loading surface, a bottom surface opposite to the loading surface, and two pins protruding from the bottom surface, the loading surface contacts the FPCB, the FPCB is electrically connected to the rigid PCB through the connector; and a fastening device comprising:
- a pressing plate comprising a pressing surface contacting the FPCB;
- two fastening bars parallel to the pressing surface, each fastening bar comprising a hook grappling with a corresponding pin, each hook comprising a resisting surface resisting on the bottom surface; and
- two connecting arms, each connecting arm connecting the pressing plate and a corresponding fastening bar.

2. The PCB assembly of claim 1, wherein the extending directions of the connecting arms are substantially perpendicular to the pressing surface.

3. The PCB assembly of claim 1, wherein each fastening bar further comprises a handle, each hook extends outward from a corresponding handle.

4. The PCB assembly of claim 3, wherein a surface of each handle opposite to the other handle comprises an anti-skid pattern.

5. The PCB assembly of claim 3, wherein each handle is L-shaped.

6. The PCB assembly of claim 3, wherein one end of each connecting arm is connected to the pressing plate, the other end of the connecting arm is connected to an adjoining portion between the handle and the hook of a corresponding fastening bar.

7. The PCB assembly of claim 1, wherein the extending directions of the two fastening bars are parallel to each other.

8. The PCB assembly of claim 1, wherein the fastening bars are made of elastic material.

9. The PCB assembly of claim 1, wherein the pressing plate, the fastening bars and the connecting arms are integrally formed with other.

10. The PCB assembly of claim 1, wherein the fastening device is made of elastic material.

11. The PCB assembly of claim 1, wherein the hooks of the two fastening bars are positioned between the pins, and each hook resists against a corresponding pin.

12. A fastening device for fastening an FPCB on a rigid PCB, the rigid PCB comprising a loading surface, a bottom surface opposite to the loading surface, and two pins protruding from the bottom surface, the fastening device comprising:
- a pressing plate comprising a pressing surface for contacting the FPCB;
- two fastening bars parallel to the pressing surface, each fastening bar comprising a hook for grappling with a corresponding pin, each hook comprising a resisting surface for resisting on the bottom surface when the fastening device is engaged with the rigid PCB; and
- two connecting arms, each connecting arm connecting the pressing plate and a corresponding fastening bar.

13. The fastening device of claim 12, wherein each fastening bar further comprises a handle, each hook extends outward from a corresponding handle.

14. The fastening device of claim 13, wherein a surface of each handle opposite to the other handle comprises an anti-skid pattern.

15. The fastening device of claim 13, wherein each handle is L-shaped.

16. The fastening device of claim 13, wherein one end of each connecting arm is connected to the pressing plate, the other end of the connecting arm is connected to an adjoining portion between the handle and the hook of a corresponding fastening bar.

17. The fastening device of claim 12, wherein the extending directions of the two fastening bars are parallel to each other.

18. The fastening device of claim 12, wherein the fastening bars are made of elastic material.

19. The fastening device of claim 12, wherein the pressing plate, the fastening bars and the connecting arms are integrally formed with other.

20. The fastening device of claim 12, wherein the fastening device is made of elastic material.

* * * * *